United States Patent
Danjean et al.

(10) Patent No.: US 10,666,295 B1
(45) Date of Patent: *May 26, 2020

(54) MITIGATION OF ERROR CORRECTION FAILURE DUE TO TRAPPING SETS

(71) Applicant: Seagate Technology LLC, Cupertino, CA (US)

(72) Inventors: Ludovic Danjean, San Jose, CA (US); Sundararajan Sankaranarayanan, Fremont, CA (US); Ivana Djurdjevic, San Jose, CA (US); AbdelHakim Alhussien, San Jose, CA (US); Erich F. Haratsch, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,272

(22) Filed: Dec. 19, 2018

Related U.S. Application Data

(63) Continuation of application No. 14/856,674, filed on Sep. 17, 2015, now Pat. No. 10,177,787.

(51) Int. Cl.
*H03M 13/11* (2006.01)
*G06F 11/10* (2006.01)
*H03M 13/00* (2006.01)

(52) U.S. Cl.
CPC ..... *H03M 13/1142* (2013.01); *G06F 11/1008* (2013.01); *H03M 13/611* (2013.01)

(58) Field of Classification Search
CPC ............ H03M 13/1142; H03M 13/611; G06F 11/1008
See application file for complete search history.

(56) References Cited

U.S. PATENT DOCUMENTS

| | | | | |
|---|---|---|---|---|
| 7,996,746 | B2 | 8/2011 | Livshitz et al. | 714/758 |
| 8,301,979 | B2 | 10/2012 | Sharon et al. | 714/763 |
| 8,504,895 | B2 | 8/2013 | Sharon et al. | 714/763 |
| 8,850,295 | B2 | 9/2014 | Chen et al. | 714/780 |
| 8,949,702 | B2 | 2/2015 | Zhang et al. | 714/799 |
| 2011/0083058 | A1 | 4/2011 | Hu | 714/758 |
| 2012/0005551 | A1 | 1/2012 | Gunnam | 714/752 |
| 2014/0143637 | A1 | 5/2014 | Cohen et al. | 714/773 |

OTHER PUBLICATIONS

Diao, et al., "LDPC codes on partial geometries: Construction, trapping set structure, and puncturing," IEEE Transaction on Information Theory, vol. 59, No. 12, pp. 7898-7914, Dec. 2013.

*Primary Examiner* — Cynthia Britt
*Assistant Examiner* — Rong Tang
(74) *Attorney, Agent, or Firm* — Setter Roche LLP; Kirk A Cesari

(57) ABSTRACT

An apparatus includes an interface and a control circuit. The interface may be configured to process transfers to/from a medium. The control circuit may be configured to generate a trapping set list of trapping sets of a low-density parity check code, classify bit positions of the trapping sets as belonging to either a user bits field or a parity bits field of a codeword, encode data using the low-density parity check code to generate the codeword, and present the codeword to the interface to transfer the codeword to the medium. The generation of the codeword may include at least one of a shortening or a puncturing of bit locations in the codeword in response to the classifying of the bit positions of the trapping sets. All of the data may be held in the bit locations of the codeword other than the bit locations that are shortened or punctured.

20 Claims, 13 Drawing Sheets

MITIGATION OF ERROR CORRECTION FAILURE DUE TO TRAPPING SETS

This application relates to U.S. Ser. No. 14/856,674, filed Sep. 17, 2015, which is incorporated by reference in its entirety.

FIELD OF THE INVENTION

The present invention relates to error floor alleviation techniques generally and, more particularly, to a method and/or architecture for mitigation of an error correction failure due to trapping sets.

BACKGROUND OF THE INVENTION

The rapid acceptance of low-density parity-check (i.e., LDPC) codes in conventional applications that specify error control coding is due to a capacity of the LDPC codes to approach theoretical performance limits. The LDPC codes are notably used in storage systems, such as magnetic recordings and flash memories. The LDPC codes perform well under iterative decoding techniques that are based on belief propagation. However, the LDPC codes experience an error-floor phenomenon due to the presence of loopy topologies in graphical representations known as trapping sets. The error-floor phenomenon makes the LDPC codes troublesome to use in applications where very low error rates are specified.

It would be desirable to implement a method and/or architecture for mitigation of an error correction failure due to trapping sets.

SUMMARY OF THE INVENTION

The present invention concerns an apparatus including an interface and a control circuit. The interface may be configured to process transfers to/from a medium. The control circuit may be configured to generate a trapping set list of trapping sets of a low-density parity check code, classify bit positions of the trapping sets as belonging to either a user bits field or a parity bits field of a codeword, encode data using the low-density parity check code to generate the codeword, and present the codeword to the interface to transfer the codeword to the medium. The generation of the codeword may include at least one of a shortening or a puncturing of bit locations in the codeword in response to the classifying of the bit positions of the trapping sets. All of the data may be held in the bit locations of the codeword other than the bit locations that are shortened or punctured.

The objects, features and advantages of the present invention include providing a method and/or architecture for mitigation of an error correction failure due to trapping sets that may (i) mitigate an error floor based on knowledge of harmful topologies, (ii) maintain information related to small trapping sets, (iii) maintain information related to dominant large trapping sets, (iv) find best matches between unsatisfied check nodes and the information concerning the trapping sets, (v) dampen log-likelihood ratio values, (vi) flip log-likelihood ratio values, (vii) shorten bit locations in a codeword based on the information, (viii) puncture bit locations in a codeword based on the information, and/or (ix) be implemented with one or more integrated circuits.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Various embodiments of the present invention generally provide error floor mitigation techniques based on knowledge of trapping sets in low-density parity-check (e.g., LDPC) code protected systems. The mitigation techniques may reduce error correction failures of LDPC encoded codewords due to trapping sets in the LDPC code. The codewords are generally stored in a storage medium and/or transferred in a transmission channel (or transmission medium). The mitigation techniques may be applied to regular LDPC and/or irregular LDPC codes. Different mitigation techniques may be used separately, in various combinations, or all together, depending on the criteria of a particular design application.

Encoding (e.g., pre-decoding) mitigation techniques generally include efficient shortening and/or puncturing of the codewords. Shortening is a process for obtaining codewords with shorter lengths and lower rates from a given error correction code codeword by assigning some bit locations (or symbols) in the given codeword to fixed values that are known to both an encoder and a decoder. The fixed values may not be transmitted and/or stored. Puncturing is a process for obtaining codewords with shorter length and lower rates from a given error correction code codeword by discarding some parity check bit locations (or symbols), or bit locations that are not part of a user message. The punctured bit locations may not be transmitted and/or stored. The shortening and/or the puncturing done during the encoding may reduce a probability that error corrections of the codewords subsequently fail due to the trapping sets.

Post-decoding mitigation techniques (e.g., after an initial decoding fails) generally include a log-likelihood ratio (e.g., LLR) value dampening and/or a bit flipping. In some embodiments, the dampening may be a K-step LLR value dampening. In some embodiments, the bit flipping may be a targeted-bit LLR flipping. The LLR value dampening and/or bit flipping may also reduce the probability that a given decoder fails to recover bits of a codeword due to the trapping sets. The techniques generally utilize information (or knowledge) of small trapping sets, dominant trapping sets, non-dominant trapping sets and/or harmful trapping sets of the code.

Figure 1:
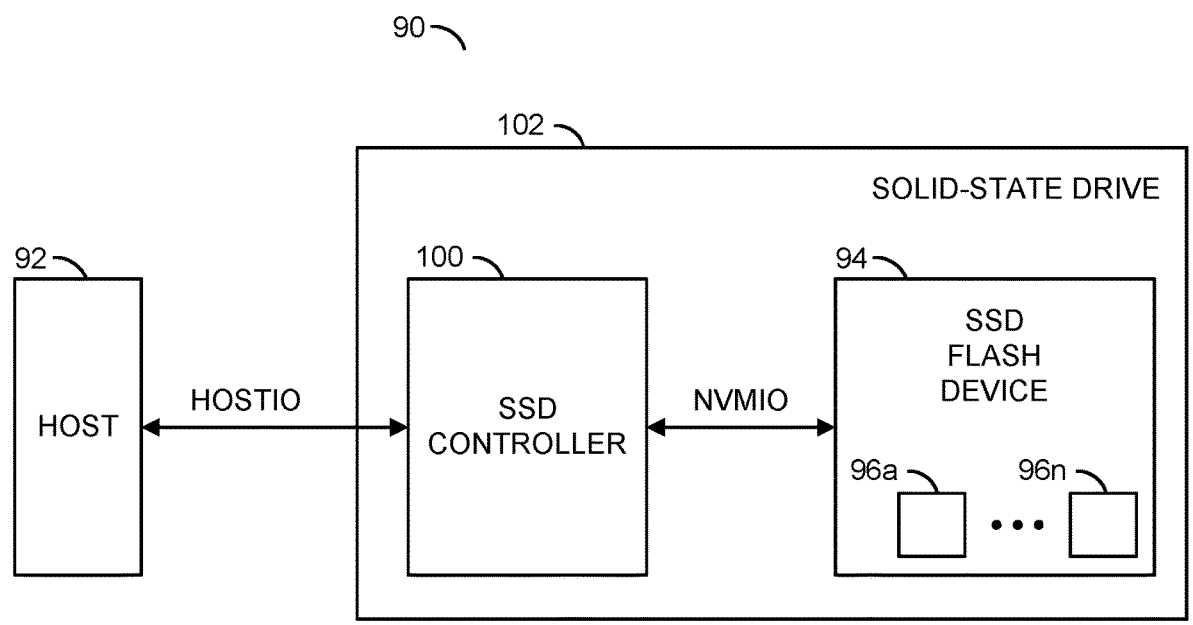
FIG. 1 is a block diagram of an apparatus.

Referring to FIG. 1, a block diagram of an example implementation of an apparatus 90 is shown. The apparatus (or circuit or device or integrated circuit) 90 implements a computer having a nonvolatile memory circuit. The apparatus 90 generally comprises a block (or circuit) 92, a block (or circuit) 94, one or more blocks (or circuits) 96a-96n and a block (or circuit) 100. The circuits 94, 96a-96n and 100 form a drive (or device) 102. The circuits 92 to 102 may represent modules and/or blocks, embodiments of which include one or more of hardware circuitry, executable code (e.g., software, microcode, programming instructions, firmware, etc.) in a storage device used by the hardware circuitry and/or one or more electronic design tools.

One or more signals (e.g., HOSTIO) are exchanged between the circuit 92 and the circuit 100. The one or more signals HOSTIO may implement a host input/output signal. The host input/output signal HOSTIO generally includes, but is not limited to, a logical address component used to access data in the circuit 102, a host command component that controls the circuit 102, a write data component that transfers write data from the circuit 92 to the circuit 100 and a read data component that transfers error corrected read data from the circuit 100 to the circuit 92.

One or more signals (e.g., NVMIO) are exchanged between the circuit 100 and the circuit 94. The one or more signals NVMIO may implement a nonvolatile memory input/output signal. The nonvolatile memory input/output signal NVMIO generally includes, but is not limited to, a physical address component used to access data in the circuit 94, a memory command component that controls the circuit 94 (e.g., read or write commands), a write codeword component that carries error correction coded and cyclical redundancy check protected write codewords written from the circuit 100 into the circuit 94 and a read codeword component that carries the error correction coded codewords read from the circuit 94 to the circuit 100.

The circuit 92 may implement a host circuit. The circuit 92 is generally operational to read data from and write data to the circuit 94 via the circuit 100. When reading or writing, the circuit 92 may transfer a logical address value in the signal HOSTIO to identify which set of data is to be written into or to be read from the circuit 94. The logical address value is generally within a logical address range of the circuit 102. The logical address value may address individual data units, such as SATA (e.g., serial-advanced technology attachment) sectors.

The circuit 94 may implement one or more nonvolatile memory circuits (or devices) 96a-96n. According to various embodiments, the circuit 94 generally comprises one or more nonvolatile semiconductor devices. The circuit 94 may be operational to store data in a nonvolatile condition. When data is read from the circuit 94, the circuit 94 may access a set of data (e.g., multiple bits) identified by an address (e.g., a physical address) in the signal NVMIO. The address is generally within a physical address range of the circuit 94. In some embodiments, the circuit 94 may be implemented as a volatile memory and/or a nonvolatile memory.

The circuits 96a-96n may implement flash memory. In various embodiments, the flash memory may be NAND flash memory, NOR flash memory, flash memory using polysilicon or silicon nitride technology-based charge storage cells, two-dimensional or three-dimensional technology-based nonvolatile memory, ferromagnetic memory, phase-change memory, racetrack memory, stacked memory, resistive random access memory, magnetic random access memory and similar types of memory devices and/or storage media. Other nonvolatile memory technologies may be implemented to meet the criteria of a particular application. In some embodiments, the circuits 96a-96n may be implemented as volatile memory circuits and/or nonvolatile memory circuits.

The circuit 100 may implement a controller circuit. The circuit 100 is generally operational to control reading from and writing to the circuit 94. The circuit 100 may include an ability to decode the read codewords received from the circuit 94. The resulting decoded data may be presented to the circuit 92 via the signal HOSTIO and/or re-encoded and written back into the circuit 94 via the signal NVMIO. The circuit 100 generally comprises one or more integrated circuits (or chips or die) implementing the controller of one or more solid-state drives (e.g., SSD), embedded storage, or other suitable control applications.

As part of encoding, the circuit 100 may be configured to access information that characterizes the trapping sets of the LDPC code when actual user data is received. The circuit 100 may encode the user data using the LDPC code to generate a codeword. The codeword may be subsequently written in the memory 94. The generation of the codeword may include a shortening step (or operation) and/or a puncturing step (or operation) of codeword bits. The shortened/punctured bits may be selected based on the information that characterizes the trapping sets. The bits selected generally reduce a probability that a decoding failure occurs due to the presence of the trapping sets of the code.

As part of the decoding, the circuit 100 may receive a codeword (possibly with errors) from the circuit 94. The circuit 100 may be configured to attempt a decoding of the possibly erroneous and/or possibly noisy codeword. If the decoding fails, the circuit 100 may access information that characterizes the trapping sets of the LDPC code. The circuit 100 may correct the codeword over one or more cycles (e.g., loops around various mitigation adjustment scenarios) using the information. The error correction generally includes detection of multiple frequencies of respective unsatisfied check nodes produced during the cycles. The LLR values used in the cycles may be adjusted based on the frequencies and the information that characterizes the trapping sets. The adjustment generally reduces a probability that the error correction of the codeword fails due to at least one trapping set.

The circuit 102 may implement a solid-state drive. The circuit 102 is generally operational to store data generated by the circuit 92 and return the data to the circuit 92. According to various embodiments, the circuit 102 may comprise one or more nonvolatile semiconductor devices, such as NAND Flash devices, phase change memory (e.g., PCM) devices, or resistive RAM (e.g., ReRAM) devices; portions of a solid-state drive having one or more nonvolatile devices; and any other volatile or nonvolatile storage media. The circuit 102 is generally operational to store data in a nonvolatile condition.

Figure 2:
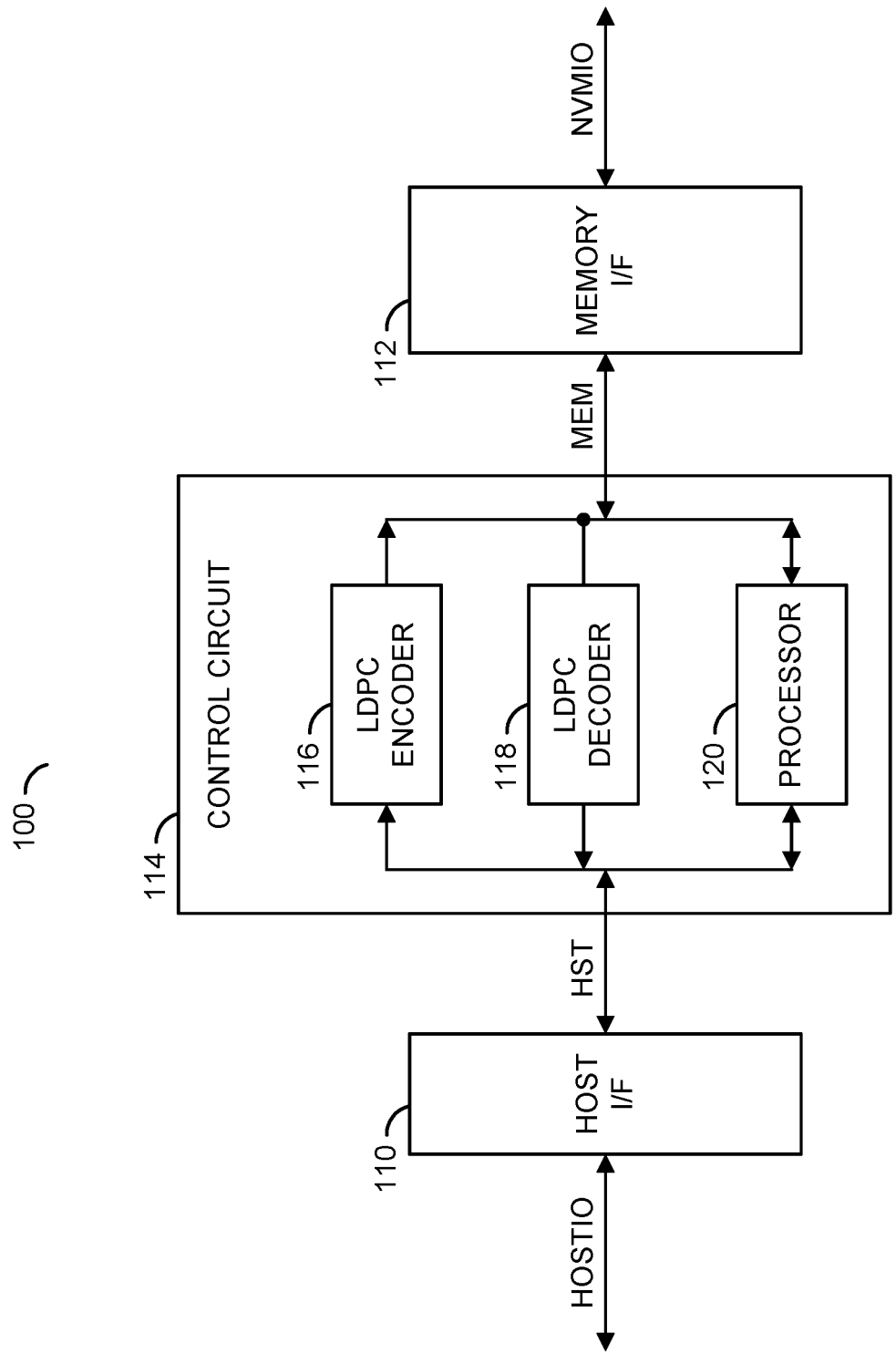
FIG. 2 is a block diagram of a controller in accordance with a preferred embodiment of the present invention.

Referring to FIG. 2, a block diagram of an example implementation of the circuit 100 is shown in accordance with a preferred embodiment of the present invention. The circuit 100 generally comprises a block (or circuit) 110, a block (or circuit) 112 and a block (or circuit) 114. The circuit 114 generally comprises a block (or circuit) 116, a block (or circuit) 118 and a block (or circuit) 120. The circuits 110 to 120 may represent modules and/or blocks, embodiments of which include one or more of hardware circuitry, executable code (e.g., software, microcode, programming instructions, firmware, etc.) in a storage device used by the hardware circuitry and/or one or more electronic design tools.

The signal HOSTIO may be exchanged with the circuit 110. The signal NVMIO may be exchanged with the circuit 112. An intermediate signal (e.g., HST) may be exchanged between the circuit 110 and the circuit 114. An intermediate signal (e.g., MEM) may be exchanged between the circuit 112 and the circuit 114.

The circuit 110 may implement a host interface circuit. The circuit 110 is generally operational to provide communication with the circuit 92 via the signal HOSTIO. Other signals may be implemented between the circuits 92 and 110 to meet the criteria of a particular application. In various embodiments, the circuit 110 may process multiple access operations to/from the circuit 92.

The circuit 112 may implement a nonvolatile memory (e.g., flash) interface circuit. The circuit 112 is generally operational to provide communication with the circuit 94 via the signal NVMIO. Other signals may be implemented between the circuits 94 and 112 to meet the criteria of a particular application. In various embodiments, the circuit 112 may process multiple read/write operations to/from the circuit 94.

The circuit 114 may implement a control circuit. The circuit 114 is generally operational to control writing data received from the circuit 92 into the circuit 94 and reading data from the circuit 94 for transfer to the circuit 92. The control may include encoding write data using an LDPC code. The encoding may include shortening and/or puncturing. The control may also include decoding read data based on the LDPC code. The decoding may include LLR value dampening and/or bit flipping.

The circuit 116 may implement an LDPC encoder circuit. The circuit 116 is generally operational to encode data received in the signal HST from the circuit 110, from the circuit 118 and/or from the circuit 120 to generate codewords. The codewords may be presented to the circuit 112 in the MEM for subsequent storage in the circuit 94.

The circuit 118 may implement an LDPC decoder circuit. The circuit 118 is generally operational to decode the codewords received from the circuit 112 in the MEM to recover the data stored in the circuit 94. The recovered data may be presented in the signal HST to the circuit 110 for transmission to the circuit 92.

The circuit 120 may implement a processor circuit. The circuit 120 is generally operational to command and/or assist with the multiple read/write requests and to control one or more reference voltages used in the circuit 94 to read the codewords. In various embodiments, the circuit 120 may be operational to calculate and/or adjust soft-decision information (e.g., the LLR values) used by the circuit 118. For some types of nonvolatile memory, the soft-decision information may be generated based on one or more reads of a given codeword from the circuit 94 at different reference voltages. Other types of flash memory may provide a form of the soft-decision information directly, such as a coarse (e.g., 3-bit resolution) voltage-level for each bit position. The soft-decision information may be stored in the circuit 114.

In various embodiments of flash memory read channels, sense amplifier comparators generally provide at least a single bit of read information for each stored bit. The circuit 118 may decode with hard decisions on each bit. Some embodiments of the flash memory read channels may provide soft-decision information for each read bit. The soft-decision information (e.g., channel LLR values) may be obtained either by reading from the same sense amplifier comparators multiple times or by equipping each memory cell with many sense amplifier comparators. In other embodiments, the soft-decision information (e.g., posterior LLR values and/or output LLR values) may be calculated by the circuit 118 and/or the circuit 120. The posterior LLR values may be conditional probabilities calculated based on relevant evidence of one or more reads from the circuit 94. The output LLR values may be probabilities calculated based on results obtained at an end of an attempted decoding by the circuit 118.

Figure 3:
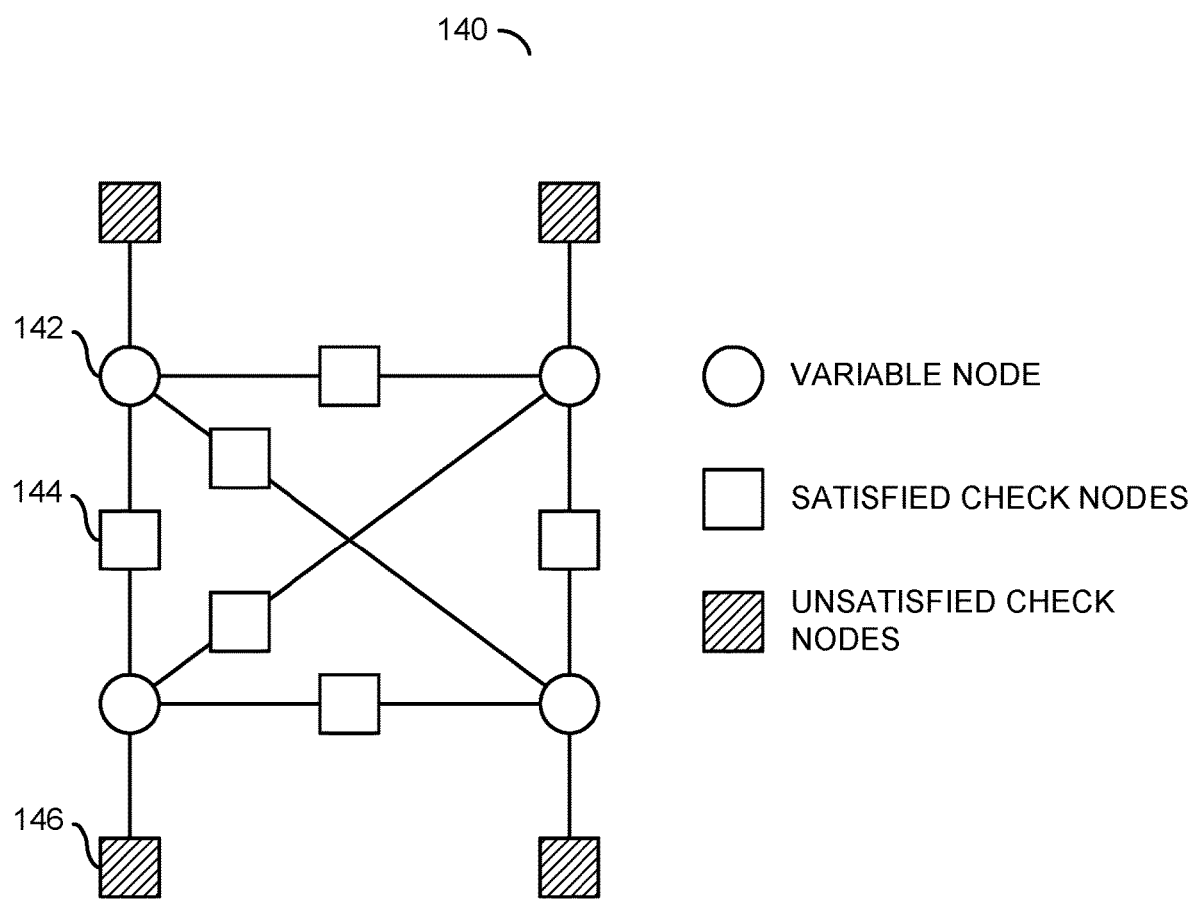
FIG. 3 is a diagram of a trapping set.

Referring to FIG. 3, a diagram of an example (4,4) trapping set 140 is shown. The example trapping set 140 generally illustrates multiple (e.g., 4) variable nodes 142, multiple (e.g., 6) satisfied check nodes 144 and multiple (e.g., 4) unsatisfied check nodes 146. Other combinations of variable nodes 142, satisfied check nodes 144 and unsatisfied check nodes 146 may exist based on the design criteria of the LDPC code.

Decoding the LDPC codewords in the circuit 118 generally uses message-passing techniques. In the message-passing techniques, computations at each vertex may use information from immediate neighbors. The message-passing techniques may be sub-optimal due to small loopy topologies that prevent the decoder circuit 118 from converging to an error-free codeword. The topologies may be referred to as the trapping sets. A trapping set may be a topological structure of the code that may prevent the decoder from converging. Depending on the decoder, trapping sets may or may not be harmful. A trapping set (a,b) is generally a set of "a" variable nodes 142 (representing "a" bits of the code) whose induced sub-graph contain "b" unsatisfied check nodes 146 that represent a subset of the parity-check constraints of the code. Where the "a" bits of a trapping set(a,b) may be in error, the circuit 118 may not eventually correct such bits. If the bits in a neighborhood of a trapping set are in error, the decoding may fail. For example, if the reliability of a few or a single erroneous bit is high, the decoding may fail even through not all of the bits of the trapping set are in error.

An error floor generally arises in a performance of a given LDPC code in a high signal-to-noise ratio (e.g., SNR) environment due to the presence of small trapping sets (a,b). At the high signal-to-noise ratio and/or with near-codewords, few errors may be introduced by a noisy read channel and/or noisy transmission channel. A near-codeword may be a codeword that is relatively close to a correct codeword, differing in only a few (e.g., 1 or 2) positions. However, the errors induced may "sit" on a trapping set or in a neighborhood of a trapping set, thereby leading to a decoding failure. The error floor phenomenon generally results in an abrupt change of a slope of an error rate performance curve at high signal-to-noise ratios (e.g., low error rates). In storage systems, the error floor may be a concern to achieve very low error rates at high signal-to-noise ratios/low raw bit error rates. For example, the error floor may limit performance at low program erase cycle (e.g., PEC) counts in flash memory systems. Improving the error floor generally leads to improvements in the number of decoding retries performed throughout the life of the flash memory, and may provide an increase in the throughput.

A trapping set (e.g., TS) list of dominant trapping sets that decide the error floor behavior may be found by an importance sampling and/or by topological searches. In the importance sampling, Monte Carlo simulations may be used with over-emphasis on the tail of the noise distribution to find the most harmful trapping sets in a bit error rate sense. In the topological searches, an enumeration of the smallest trapping sets is generally performed. The smallest trapping sets are usually the most likely pseudo-codewords to trap a decoder at the high signal-to-noise ratio, and so may be the most tractable to be searched. The TS list may also be created by simulation at the high signal-to-noise ratios and recording low weight error patterns. For each LDPC code, a characterization list that contains information characterizing the most harmful trapping sets and associated probabilities of occurrences may be created and stored. The trapping set search may also be extended to the search of the codewords because a codeword of weight d may be a trapping set (d,0).

On the encoder side, the mitigation techniques may include efficient shortening and/or puncturing of the codewords. In general, the LDPC codes may be designed to be close to or a match with a set of parameters (e.g., code rate, user bit length, column-weight, etc.) of the encoder/decoder system. The design of the LDPC code may target good performing codes. For example, a given signal-processing system may specify a fixed bit length (typically in bytes) of the user data. The fixed bit length may be different (e.g., smaller) than a user bit length of the designed code. In such scenarios, the user bits of the code may be shortened to match the fixed bit length of the user data. In other situations, the shortening and/or the puncturing of the codewords may be used to fit the codewords into flash pages sizes, fit the codewords into sectors and/or generally not waste storage space and/or transmission bandwidth.

In systematic codes, the bits of the user data may be present in the codeword (e.g., in a user bits field of the codeword) followed by parity bits (e.g., in a parity bits field of the codeword). The parity bits generally provide protection of the bits in the user bits field. With some row and/or columns operations, a given LDPC code may be reshaped into a systematic code.

Figure 4:
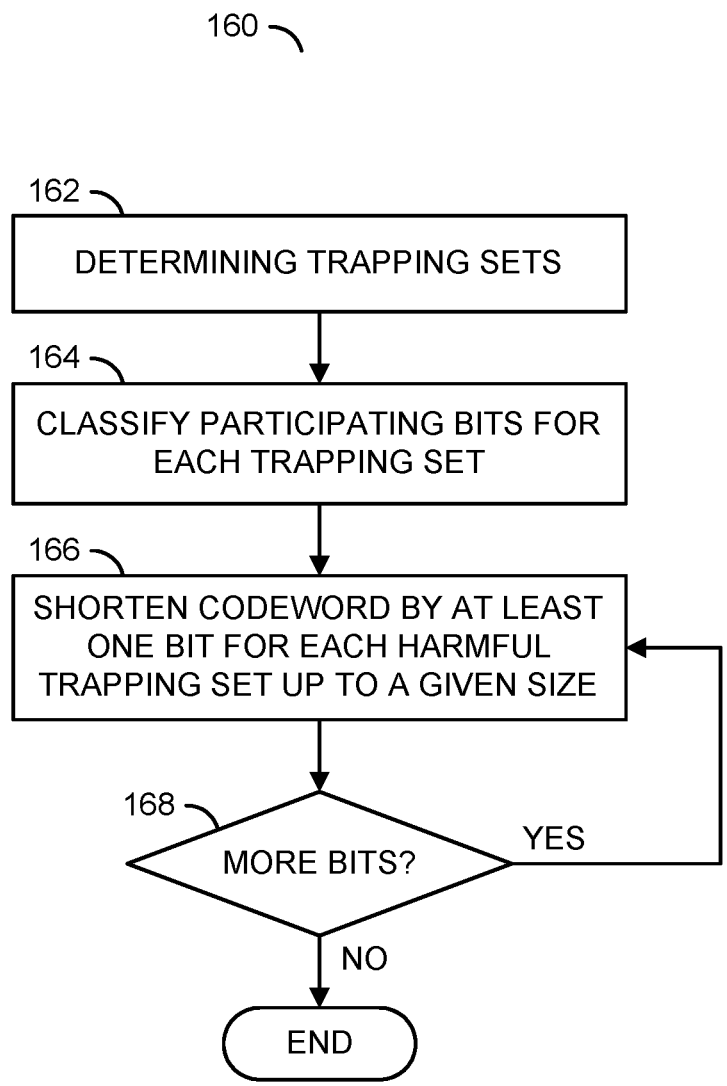
FIG. 4 is a flow diagram of a method for shortening.

Referring to FIG. 4, a flow diagram of an example method 160 for shortening is shown. The method (or process) 160 may be implemented in part by the circuit 100. The method 160 generally comprises a step (or state) 162, a step (or state) 164, a step (or state) 166 and a decision step (or state) 168. The steps 162-168 may represent modules and/or blocks, embodiments of which include one or more of hardware circuitry, executable code (e.g., software, microcode, programming instructions, firmware, etc.) in a storage device used by the hardware circuitry and/or one or more electronic design tools.

Known locations in the user bit field of the codeword that do not contain bits of the actual user (or host) data may be referred to as shortened bits. At the encoder side, the shortened bits may be assigned a predetermined value (e.g., zero or one) at the known locations by the circuit 116. Afterwards, the parity bits may be computed as usual (e.g., using the generator matrix) and consider the shortened bits. In various embodiments, the shortened bits may not be transmitted/stored.

At the decoder side, the circuit 118 generally knows the locations of the user bits of the codeword that were shortened. The circuit 118 may assign saturated (e.g., high probability) LLR values corresponding to the shortened bits given by the encoder circuit 116. During the message-passing performed by the circuit 118 on a Tanner graph of the code, saturating the LLR values of the shortened bits generally leads to improvements in a convergence speed of the decoding in the neighborhood of the variable nodes corresponding to the shortened bits. The saturations may be treated as disconnects of the edges/bits from the graph.

For any given LDPC code where a shortening is performed, the bit locations to be shortened in the user bits field may be chosen using the characterization information known about the trapping sets of the given LDPC code. The shortenable bit locations may or may not be consecutive and/or before or after non-shortened bits. The shortening step may select the shortened bit locations to take advantage of the topology of the LDPC code to improve the error-correction capabilities.

Figure 5:
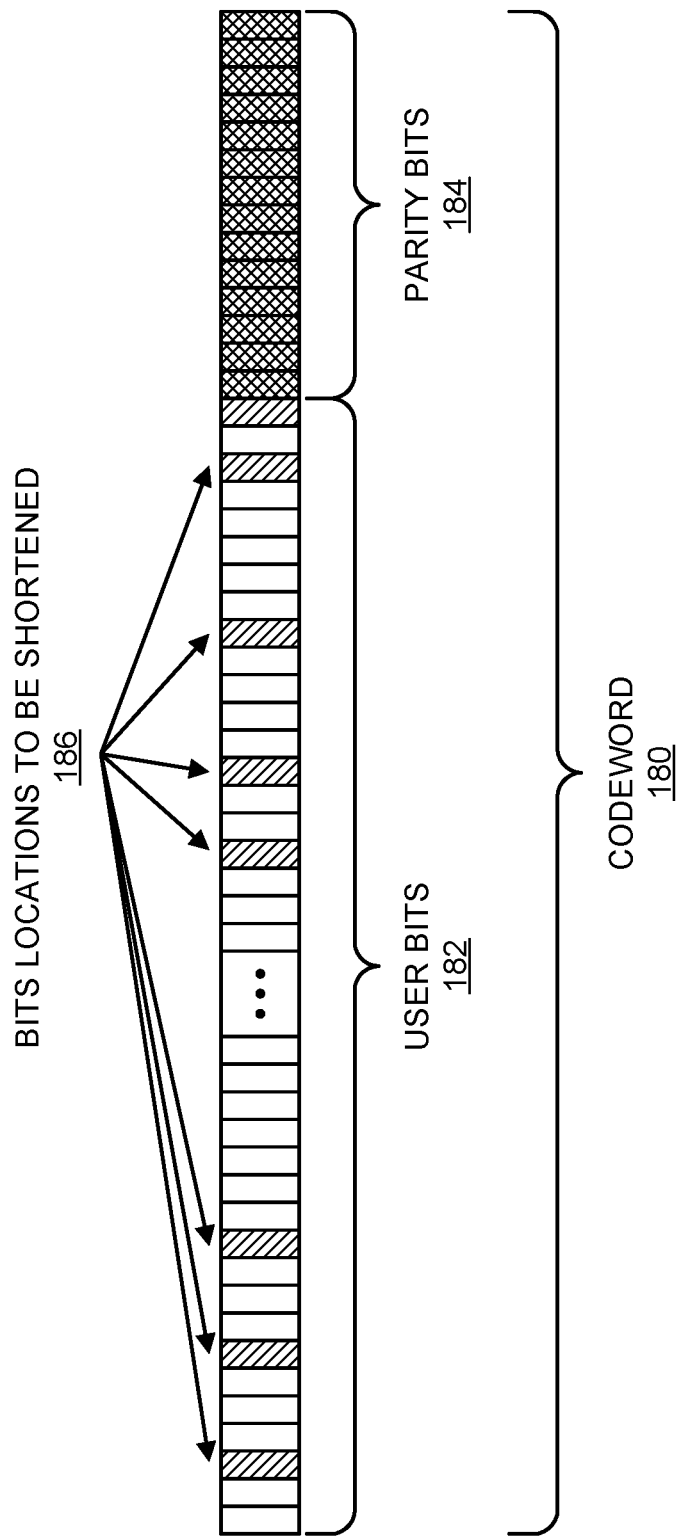
FIG. 5 is a diagram of a codeword subjected to the shortening.

Referring to FIG. 5, a diagram of an example codeword 180 subjected to a shortening is shown. The codeword 180 generally comprises a field (or area) 182 and a field (or area) 184. The field 182 may implement the user bit field of the codeword 180. The user bit field 182 may contain multiple bits of the user data (white boxes) and multiple bit locations to be shortened (shaded boxes) 186. The field 184 may implement the parity bit field of the codeword 180. The parity bit field 184 generally contains multiple bits of parity information (cross-hatched boxes) used to protect the bits in the user bit field 182.

Returning to FIG. 4, a processor (e.g., the circuit 120 and/or an external computer) may generate the TS list of the given LDPC code that may lead to decoding failures (e.g., found by enumeration and/or simulation) in the step 162. Such trapping sets are generally responsible for the appearance of the error floor. In various embodiments, the TS list may not be stored in the circuit 100 for shortening. Instead, the TS list may be used to create the characterization list of potential locations (or positions) to shorten.

In the step 164, the bits participating in each trapping set may be classified as belonging to the user bits field 182 or the parity bits field 184. Depending on a maximum number of bits to be shortened, a goal may be to shorten at least one bit for each harmful trapping set, TS(a,b), up to a target number of bits to be shortened (e.g., Ns) among the bits in the user bits field 182. In the step 166, at least one bit location 186 in the user bit field 182 of the codeword 180 may be selected for shortening (e.g., set to the predetermined value) for each harmful trapping set. The bit locations 186 may be a subset less than all of the locations in the user bit field 182. A check may be performed in the decision step 168 to determine if a number of bit locations 186 that are shortened is less than the target number Ns. If the number of bit locations 186 already shortened is less than the target number Ns, the method 160 may return to the step 166 and select at least one more bit location 186 in the user bit field 182 to shorten for a trapping set (a',b') not yet considered. Once the number of bit locations 186 that have been shortened matches the target value Ns, the method 160 may end.

At the decoder side, the shortened bit locations 186 may ensure that at least one bit is known for the more harmful trapping sets up to a certain size and hence not in error. From the definition of trapping sets, the known error-free bits may improve the error correction capability of the LDPC code as the smallest number of bits (e.g., non-shortened bits) that may potentially cause a decoding to fail has become larger.

Regarding the step 166, depending on the maximum number of bits to be shortened, a goal in various embodiments may be to shorten exactly a single bit for each type of harmful trapping set TS(a,b) up to the target number given size Ns. Shortening a single bit for each type of trapping set generally maximizes the number of trapping sets taken into account. If a given bit participates in a number (e.g., J) of trapping sets (a,b), the given bit takes care of the J trapping sets when set to the known predetermined value. The given bit may provide a maximum impact on an improvement of the performance in the error floor.

The characterization list may be designed in the step 164 and used in the step 166. A shortening list of variable node candidates to be shortened may be maintained, such that for each trapping set size, the shortening list may be used to choose the bits that are more suitable to be shortened. After the bits are shortened, the shortening list may be updated. From a topological standpoint and using a minimum-sum based decoding, the shortened bits may be considered disconnected from the graph 140 because the shortened bits receive the highest reliability LLR value and have a sign that may not be flipped.

Figure 6:
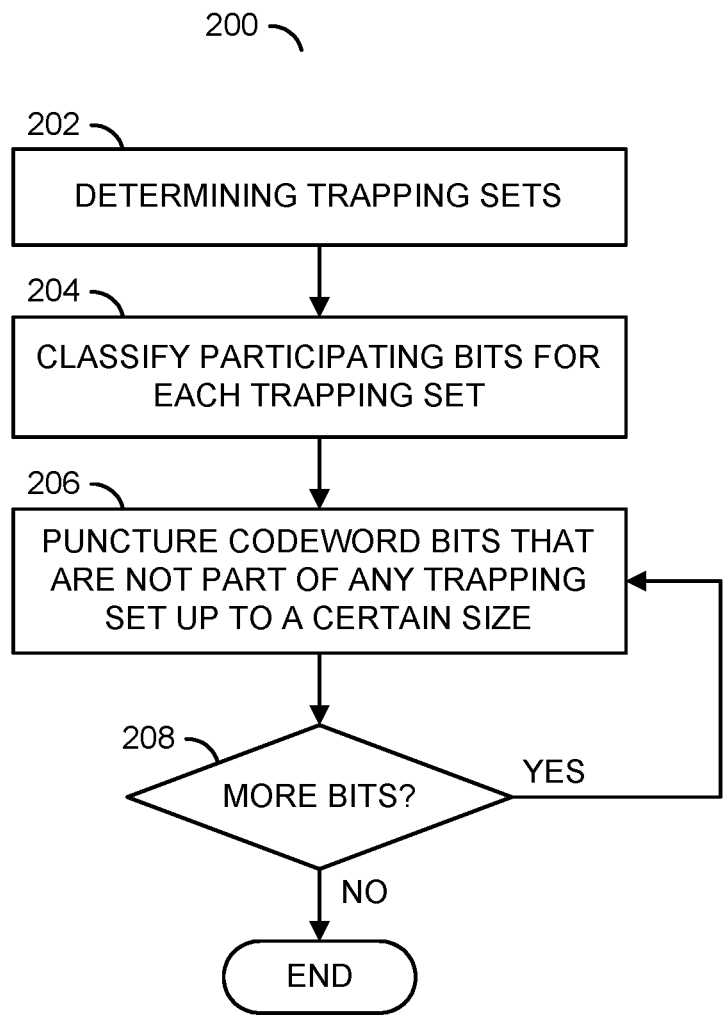
FIG. 6 is a flow diagram of a method for puncturing.

Referring to FIG. 6, a flow diagram of an example method 200 for puncturing is shown. The method (or process) 200 may be implemented in part by the circuit 100. The method 200 generally comprises a step (or state) 202, a step (or state) 204, a step (or state) 206 and a decision step (or state) 208. The steps 202-208 may represent modules and/or blocks, embodiments of which include one or more of hardware circuitry, executable code (e.g., software, microcode, programming instructions, firmware, etc.) in a storage device used by the hardware circuitry and/or one or more electronic design tools.

Bit locations in the user bit field of a punctured codeword that do not contain the bits of the actual user data may be referred to as the punctured bits. For any given LDPC code where a puncturing is performed, the bit locations to be punctured in the codeword 180 may be selected based on the characterization list such that the error-rate performance is not made worse.

At the encoder side, the punctured bit locations may be assigned a random value (e.g., zero or one) at known locations. Afterwards, the parity bits may be computed as usual (e.g., using the generator matrix). The selections generally ensure that none of the bits in any (small) trapping set may be received by the circuit 118 as an intentional erasure. The punctured bit locations may or may not be consecutive and/or at the beginning or the end of the codeword 180. In various embodiments, the punctured bits may not be transmitted/stored.

At the decoder side, the circuit 118 generally knows the locations of the bits of the codeword 180 that were punctured. The circuit 118 may assign an erasure LLR value (e.g., a probability value of zero or unknown) corresponding to the punctured bit locations given by the encoder 116. During the message-passing performed by the circuit 118 on the Tanner graph of the code, the erasure LLR values in the punctured bit locations generally avoid making the error rate worse.

Figure 7:
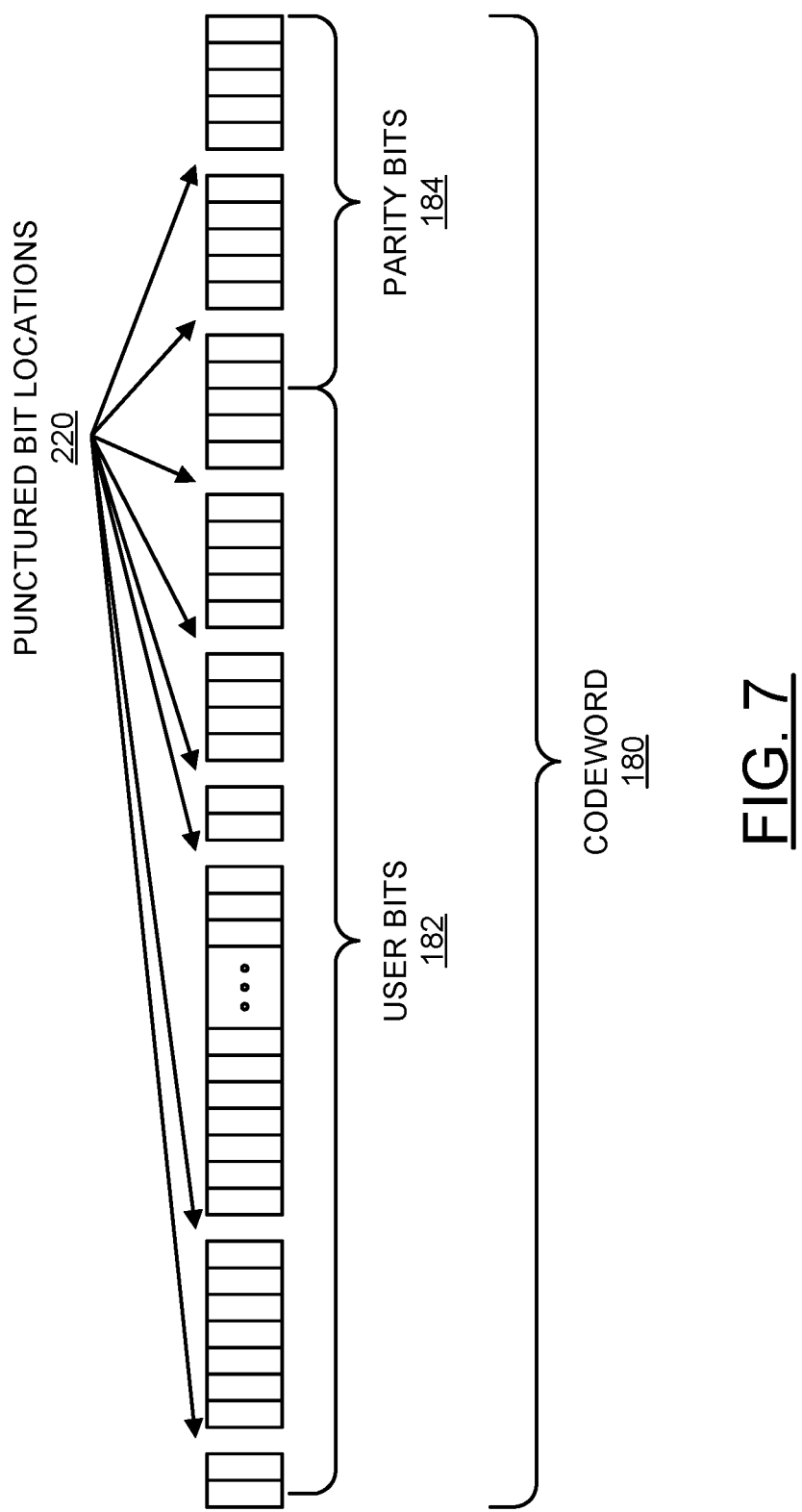
FIG. 7 is a diagram of a codeword subjected to the puncturing.

Referring to FIG. 7, a diagram of the example codeword 180 subjected to a puncturing is shown. The codeword 180 generally comprises the user bits field 182 and the parity bits field 184. The puncturing may take place at multiple bit locations 220 in the parity bits field 184, the user bits field 182, or both.

Returning to FIG. 6, a processor (e.g., the circuit 120 and/or an external computer) may generate the TS list for the given LDPC code that may lead to decoding failures (e.g., found by enumeration and/or simulation) in the step 202. In various embodiments, the TS list may not be stored in the circuit 100 for puncturing. Instead, the TS list may be used to create the characterization list of potential locations (or positions) to puncture. The characterization list generally characterizes the trapping sets. Similar to the shortening list, a puncturing list of variable node candidates to be punctured may be maintained, such that at each step (e.g., for each trapping set size), the puncturing list may be used to choose the bits that are more suitable to be punctured. After the bits are punctured, the puncturing list may be updated.

In the step 204, the bits participating in each trapping set may be classified into the user bits field 182 or the parity bits field 184 if the puncturing is limited to one of the two fields 182 or 184. The step 204 may be skipped where the puncturing occurs among both fields 182 and 184.

Depending on a maximum number of bits to be punctured, a goal may be to puncture bits that are not part of any harmful trapping set (a,b) up to a given (or chosen) size. In the step 206, at least one bit location 220 in the user bit field 182 and/or the parity bit field 184 of the codeword 180 may be selected for puncturing. A check may be performed in the decision step 208 to determine if a number of punctured bit locations 220 is less than the maximum number of bits to be punctured. If less than the maximum number of bits to be punctured, the method 200 may return to the step 206 and select at least one more bit location 220 to puncture. Once the number of punctured bit locations 220 matches the maximum number, the method 200 may end.

The method 200 generally avoids an intentional introduction of erasures in the trapping sets since doing so may decrease the convergence speed of the decoding. In certain cases, erasures in the trapping sets may worsen the error rate performance. Furthermore, the induced sub-graph of the selected punctured bits should not contain a stopping set because doing so may lead to a decoding failure. A list of the stopping sets may also be maintained to prevent puncturing of bits whose induced sub-graph contain a stopping set. A stopping set may be a subset V of a variable node graph wherein all check neighbors of V may be connected to V at least twice. No degree-1 check nodes generally exist in the induced sub-graph of V.

In various embodiments, the circuit 100 may generate the codewords 180 using both the shortening and the puncturing. Once the bit locations to be shortened are decided, the characterization list may be updated to characterize the "remaining" trapping sets, and thereafter stored. The characterization list generally remains the same after the puncturing to avoid assigning erasure LLR values within a trapping set.

With puncturing and/or shortening, the encoder circuit 116 and the decoder circuit 118 are generally aware of bit positions where the puncturing and/or the shortening is applied. The puncturing may be performed on the encoded bits. The shortening may be performed in the user bits field prior to encoding. With the shortening, the predetermined bit value assignment may be known at the encoder side and at the decoder side. For the shortened bit locations, the LLR values may be set to the saturated LLR values corresponding to the predetermined bit value assigned to the shortened bits. With the puncturing, the bit values in the punctured bit locations are generally unknown at the decoder side. For the punctured bit locations, the corresponding LLR values may be set to the erasure value. The choice of bits to puncture generally differs from the choice of bits to shorten so as not to worsen the overall error-rate performance. The punctured/shortened bits may not be transmitted in a communication medium and/or written in the storage medium.

For cases where the trapping set enumeration cannot be used (e.g., cases of high complexity), selecting the bit locations to shorten and/or puncture may be determined based on a number of cycles in which each bit is involved. Trapping sets may be considered, by definition, as a union of short cycles. Bit locations that participate in the highest number of short(est) cycles may be shortened. Bit locations that participate in the least number of short(est) cycles may be punctured. If a girth of the code is not too important (e.g., 6 or 8), the enumeration of such cycles may be relatively simple to perform.

In various applications, the LDPC codes may contain columns with a unity weight (e.g., 1). If shortening is performed, the bits with a degree-1 may preferably be shortened. Such cases generally prevent the bits from being in error after the transmission/storage and so may lead to a decoding failure or slow down the convergence time of the decoding. If puncturing is performed, bits with the degree-1 are generally not punctured. Such cases may prevent the bits from receiving the erased LLR value that may potentially lead to a decoding failure, or slow down the convergence of the decoding.

Figure 8:
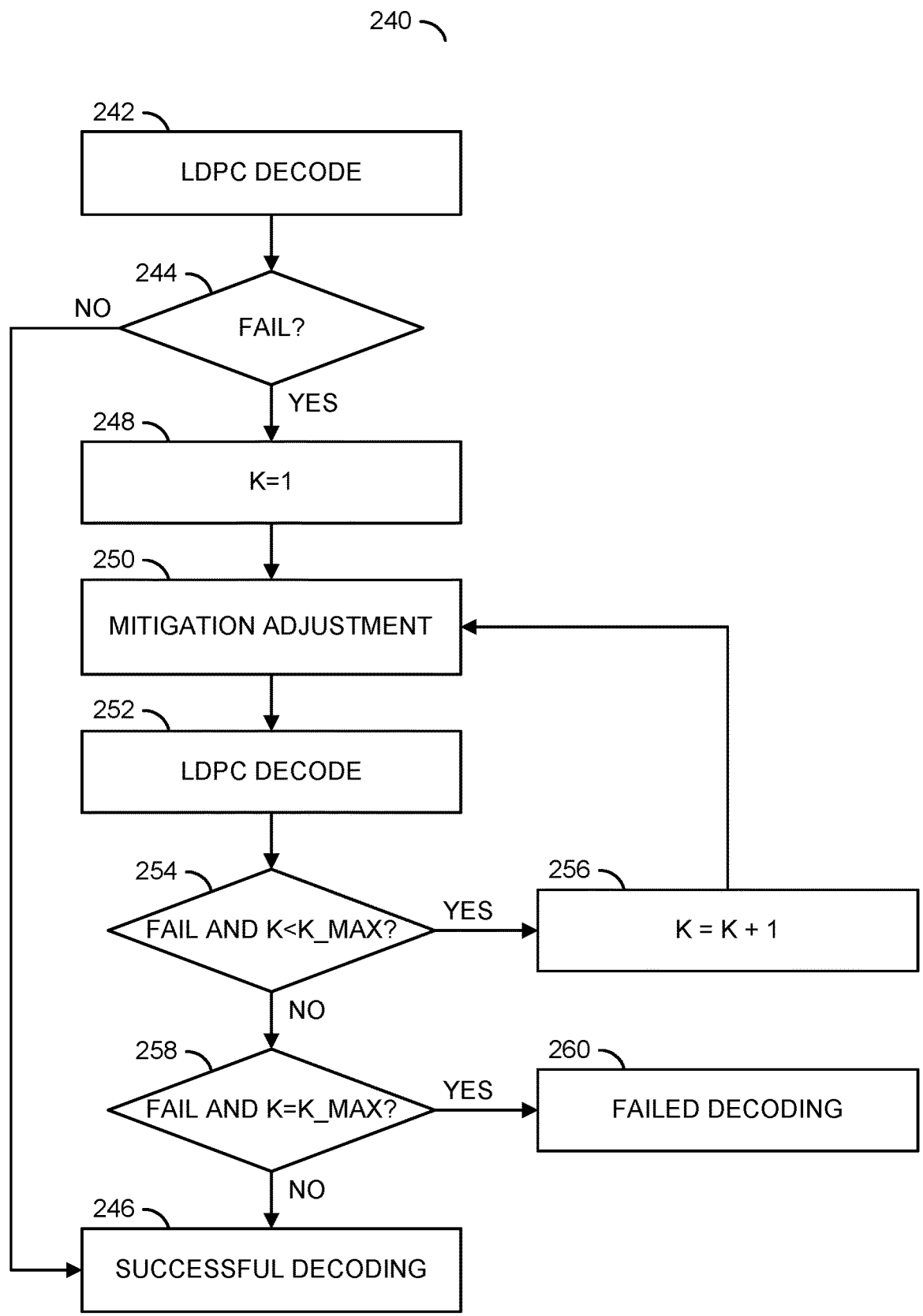
FIG. 8 is a flow diagram of a method for post-decoding.

Referring to FIG. 8, a flow diagram of an example method 240 for post-decoding is shown. The method (or process) 240 may be implemented in the circuit 100. The method 240 generally comprises a step (or state) 242, a decision step (or state) 244, a step (or state) 246, a step (or state) 248, a step (or state) 250, a step (or state) 252, a decision step (or state) 254, a step (or state) 256 a decision step (or state) 258 and a step (or state) 260. The steps 242-260 may represent modules and/or blocks, embodiments of which include one or more of hardware circuitry, executable code (e.g., software, microcode, programming instructions, firmware, etc.) in a storage device used by the hardware circuitry and/or one or more electronic design tools. The post-decoding mitigation techniques (e.g., after an initial decoding fails) generally include the LLR value dampening (e.g., a K-step LLR value dampening) and the bit flipping (e.g., a targeted bit-LLR flipping).

The circuit 118 may attempt in the step 242 to decode a codeword. In the decision step 244, if the decoding of the step 242 is successful, the circuit 118 may indicate a successful decoding in the step 246 and present the decoded (or recovered) data. If the decoding in the step 242 fails, a counter value (e.g., K) may be initialized (e.g., K=1) by the circuit 120 in the step 248. One or more mitigation adjustment techniques may be performed by the circuit 120 in the step 250. The circuit 118 may attempt to decode the codeword again in the step 252 using the adjusted data.

If the decoding fails and the counter value K is less than a maximum value (e.g., K_MAX), the circuit 120 may increment the counter value K in the step 256 and return to the step 250 for further adjustments. If the decoding is successful or the counter value K has reached the value K_MAX according to the decision step 254, the circuit 120 may check for pass/failed decoding in the decision step 258. If the last decoding attempt has failed and the counter value K matches the maximum value K_MAX, the circuit 120 (and/or the circuit 118) may indicate a decoding failure in the step 260. If the decoding passed at the decision step 258, the circuit 118 may indicate the successful decoding and present the decoded data in the step 246.

Figure 9:
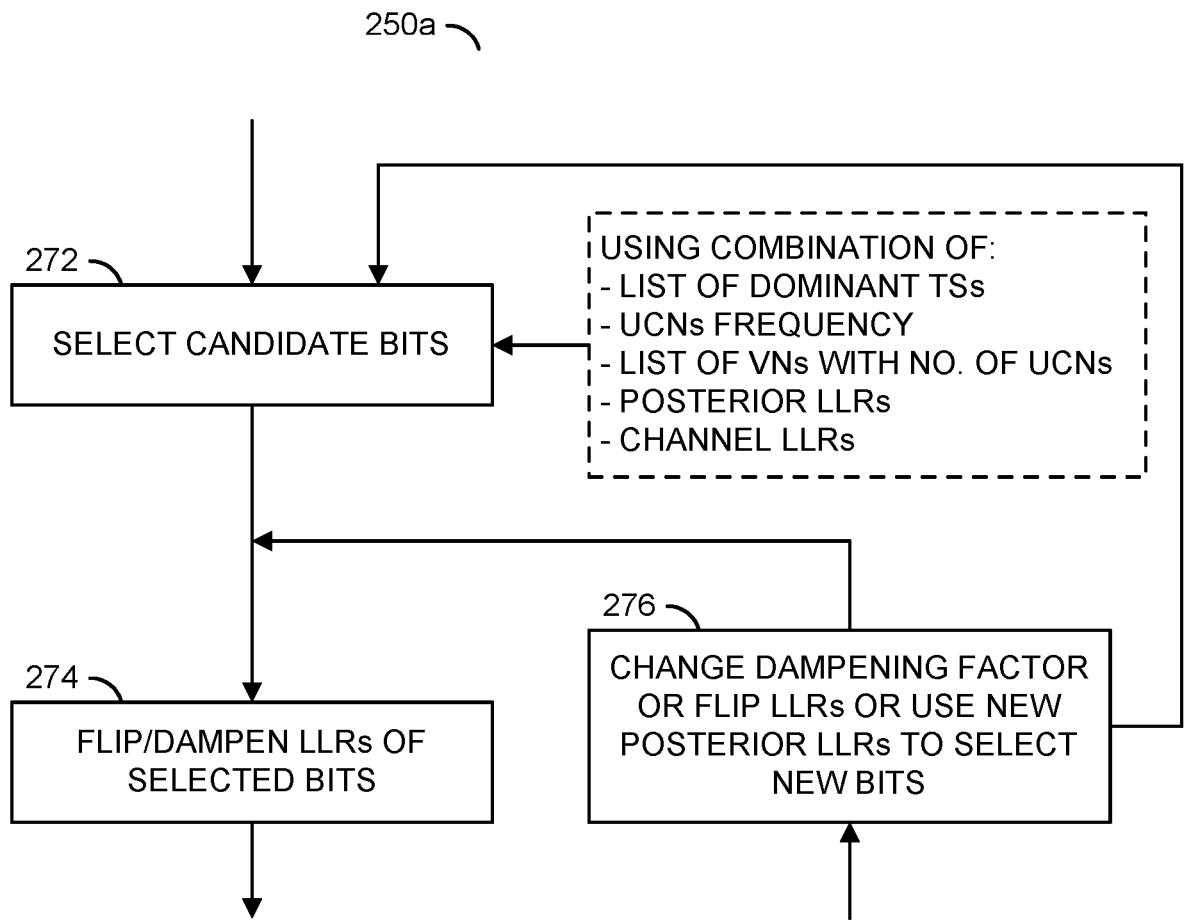
FIG. 9 is a flow diagram of a method for bit flipping/dampening.

Referring to FIG. 9, a flow diagram of an example method 250a for bit flipping/dampening is shown. The method 250a may be a variation of the step 250. The method (or process) 250a may be implemented in the circuit 100. The method 250a generally comprises a step (or state) 272, a step (or state) 274 and a step (or state) 276. The steps 272-276 may represent modules and/or blocks, embodiments of which include one or more of hardware circuitry, executable code (e.g., software, microcode, programming instructions, firmware, etc.) in a storage device used by the hardware circuitry and/or one or more electronic design tools.

After the initial decoding has failed and the counter value K is initialized in the steps 242-246 (FIG. 8), candidate bit locations may be selected by the circuit 120 in the step 272. The selection may be based on a combination of the dominant trapping sets, the unsatisfied check nodes (e.g., UCN) frequencies, a variable node (e.g., VN) list of the variable nodes 142 with the number of unsatisfied check nodes 146, the posterior LLR values and/or the channel LLR values. In the step 274, the selected bit locations may undergo an adjustment by flipping and/or dampening the LLR value.

The circuit 118 may attempt to decode the codeword again in the step 252 (FIG. 8) using the dampened and/or flipped LLR values. If the decoding is successful, the circuit 118 may indicate the successful decoding and present the decoded data in the step 246 (FIG. 8). If the decoding fails, the circuit 120 may increment the counter value K in the step 256 (FIG. 8). The circuit 120 may subsequently change the dampening factors and/or flip different LLR values or identify new posterior LLR values useable in selecting new bit locations to modify in the step 276. The completed step 276 may return to the step 274 for changes in the dampening factor and/or flipping of the LLR values. The completed step 276 may return to the step 272 for use of the new posterior LLR values to select new bit locations. The loop around the steps 250a, 252, 254 and 256 may continue until either the decoding passes or the counter value K reaches the maximum value K_MAX.

Figure 10:
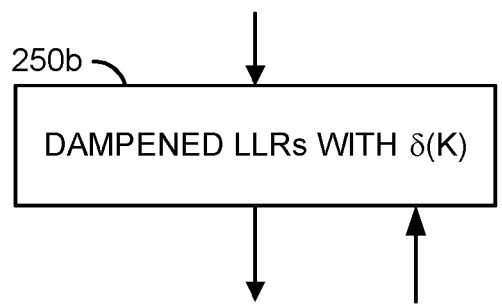
FIG. 10 is a flow diagram of a method for a multi-step dampening.

Referring to FIG. 10, a flow diagram of an example method 205b for a multi-step dampening is shown. The method 250b may be a variation on the step 250. The method (or process or step) 250b may be implemented in the circuit 100. The step 250b may represent a module and/or block, embodiments of which include one or more of hardware circuitry, executable code (e.g., software, microcode, programming instructions, firmware, etc.) in a storage device used by the hardware circuitry and/or one or more electronic design tools.

In a trapping set (a,b), bits of the trapping set in error and with large magnitude LLR values may emphasize the harmfulness of the trapping set. Re-running the decoding with the channel LLR values dampened by a known dampening factor generally helps decode the bits in the trapping set.

After the initial decoding has failed and the counter value K is initialized in the steps 242-246 (FIG. 8), the circuit 120 may dampen the LLR values with a dampening factor in the step 250b. The dampening factor may be denoted as $\delta(K)$, with $\delta(K)>0$. The dampened LLR values may be used by the circuit 118 in a subsequent decoding attempt in the step 252 (FIG. 8). At each cycle where the counter value K is less than the maximum value K_MAX, a different dampening factor may be used. In some embodiments, the LLR values of all the bits may be dampened using $\delta(K)$ in the step 250b. In other embodiments, a selected subset less than all of the LLR values may be dampened and the remaining LLR values left unchanged. Typically, a progressive dampening factor $\delta(K)$ may increase the amount of dampening in each sequential cycle (e.g., $1-\delta(K)>\delta(K+1)$). The maximum number of dampening cycles K_MAX may be decided by the precision of the LLR values. The loop around the steps 250b, 252, 254 and 256 may continue until either the decoding passes or the counter value K reaches the maximum value K_MAX.

In some embodiments, different incremental step sizes may be applied to the dampening factors used to adjust the LLR values for different sets of bits. For example, instead of applying a single step size to a single dampening factor (e.g., $\delta(K)$) for all LLR values, multiple (e.g., D) step sizes may be used to establish multiple dampening factors (e.g., $\delta_1(K)$, $\delta_2(K)$, . . . , $\delta_D(K)$) for the various sets. The dampening factors $\delta_1(K)$ to $\delta_D(K)$ may change at independent and/or dependent rates as the counter value K is increased. For example, a set of LLR values may be dampened with the dampening factor $\delta_1(K)$. Another set of LLR values may be dampened with the dampening factor $\delta_2(K)$, where $\delta_1(K)$ $\neq \delta_2(K)$ for some values of K. Still another set of LLR values may be dampened with the dampening factor $\delta_3(K)$, and so on. The value D generally matches or is smaller than the number of bits in the codeword.

The variable step sizes used in the dampening factors may provide for more aggressive dampening of some LLR value sets than other LLR value sets. For instance, a set of selected LLR values may be dampened with a dampening factor adjusted each cycle with a given step size. In parallel, a set of non-selected LLR values may be dampened with another dampening factor adjusted each cycle with a different (e.g., smaller) step size.

Distinctions may also be made at the individual bit level and/or within bit sets (e.g., the set of the selected bits). For example, if a particular bit is known to be part of a large number of harmful trapping sets, an aggressive dampening step size may be applied to the dampening factor for the LLR value of the particular bit. Other LLR values of other bits may be dampened based on one or more less aggressive step sizes.

Figure 11:
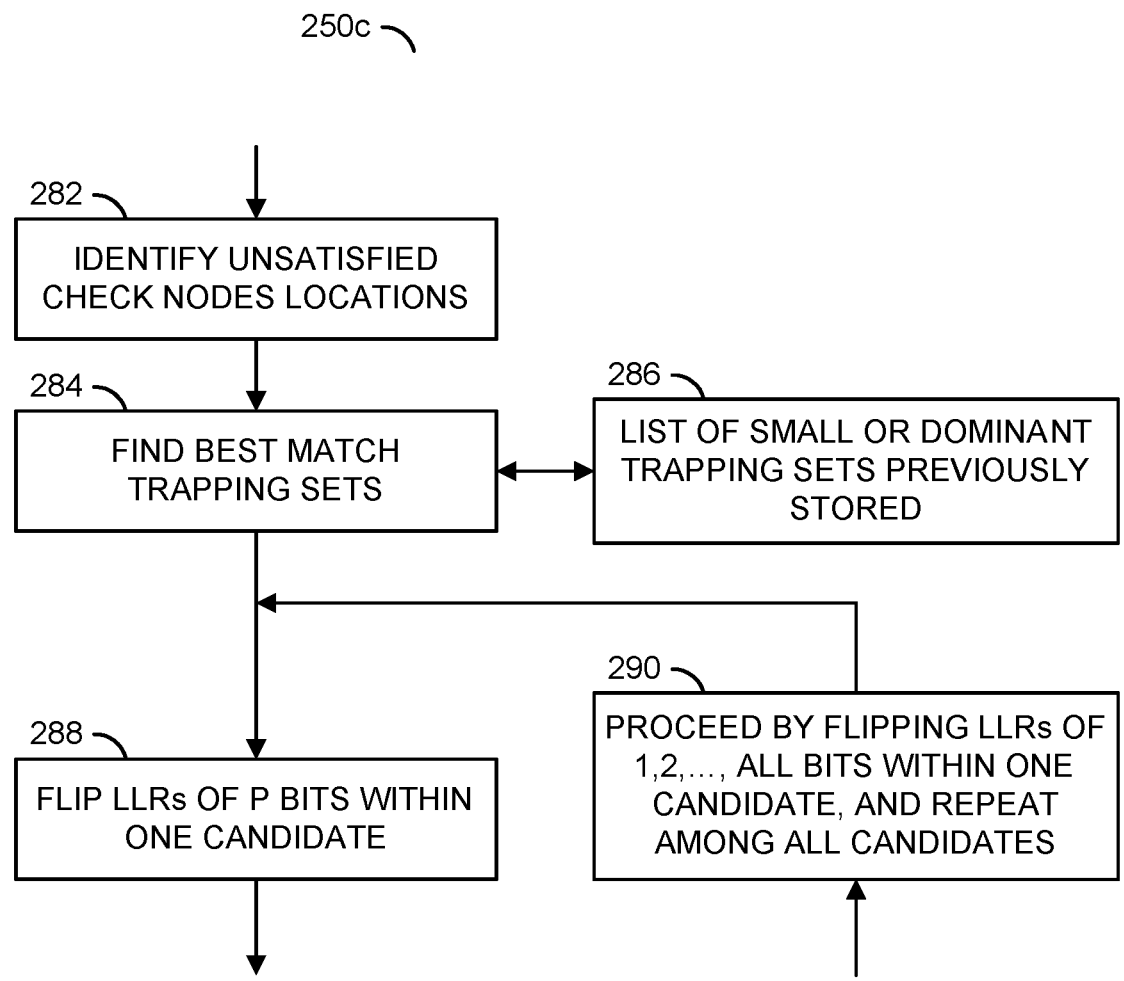
FIG. 11 is a flow diagram of a method for targeted bit-flipping.

Referring to FIG. 11, a flow diagram of an example method 250c of targeted bit-flipping is shown. The method 250c may be a variation of the step 250. The method (or process) 250c may be implemented in the circuit 100. The method 250c generally comprises a step (or state) 282, a step (or state) 284, a step (or state) 286, a step (or state) 288 and a step (or state) 290. The steps 282-290 may represent modules and/or blocks, embodiments of which include one or more of hardware circuitry, executable code (e.g., software, microcode, programming instructions, firmware, etc.) in a storage device used by the hardware circuitry and/or one or more electronic design tools.

After the initial decoding has failed and the counter value K is initialized in the steps 242-246 (FIG. 8), the location of the unsatisfied check nodes (e.g., UCN) may be presented by the circuit 118 in the step 282. If the number of unsatisfied check nodes is small (e.g., less than approximately 10 nodes), the decoding failure likely occurred due to a small trapping set. In the step 284, the circuit 120 may compare the locations of the unsatisfied check nodes with the indices of the unsatisfied check nodes in the characterization list previously stored in the step 286. The comparison generally identifies (or produces) candidate trapping sets that may have prevented the decoding from converging. If no exact match exists, a subset of unsatisfied check nodes may be evaluated. One or more best matches (e.g., partial matches) may be considered as candidates in the step 284. The match may be one or multiple listed trapping sets or a subset of a larger trapping set.

In the step 288, the circuit 120 may flip the LLR values of P bits within a single candidate, where the value P may be an integer of one or greater. The circuit 118 may attempt to decode the codeword again based on the flipped LLR values in the step 252 (FIG. 8). Until the decoding converges, the step 290 may flip the LLR values of 1, 2, 3, . . . all bits within the candidates. The step 290 may start by flipping all bits. Thereafter, the step 290 may return to the step 288 to flip the P bits and attempt the decoding again in the step 252. The loop around the steps 250c, 252, 254 and 256 may continue until either the decoding passes or the counter value K reaches the maximum value K_MAX.

Figure 12:
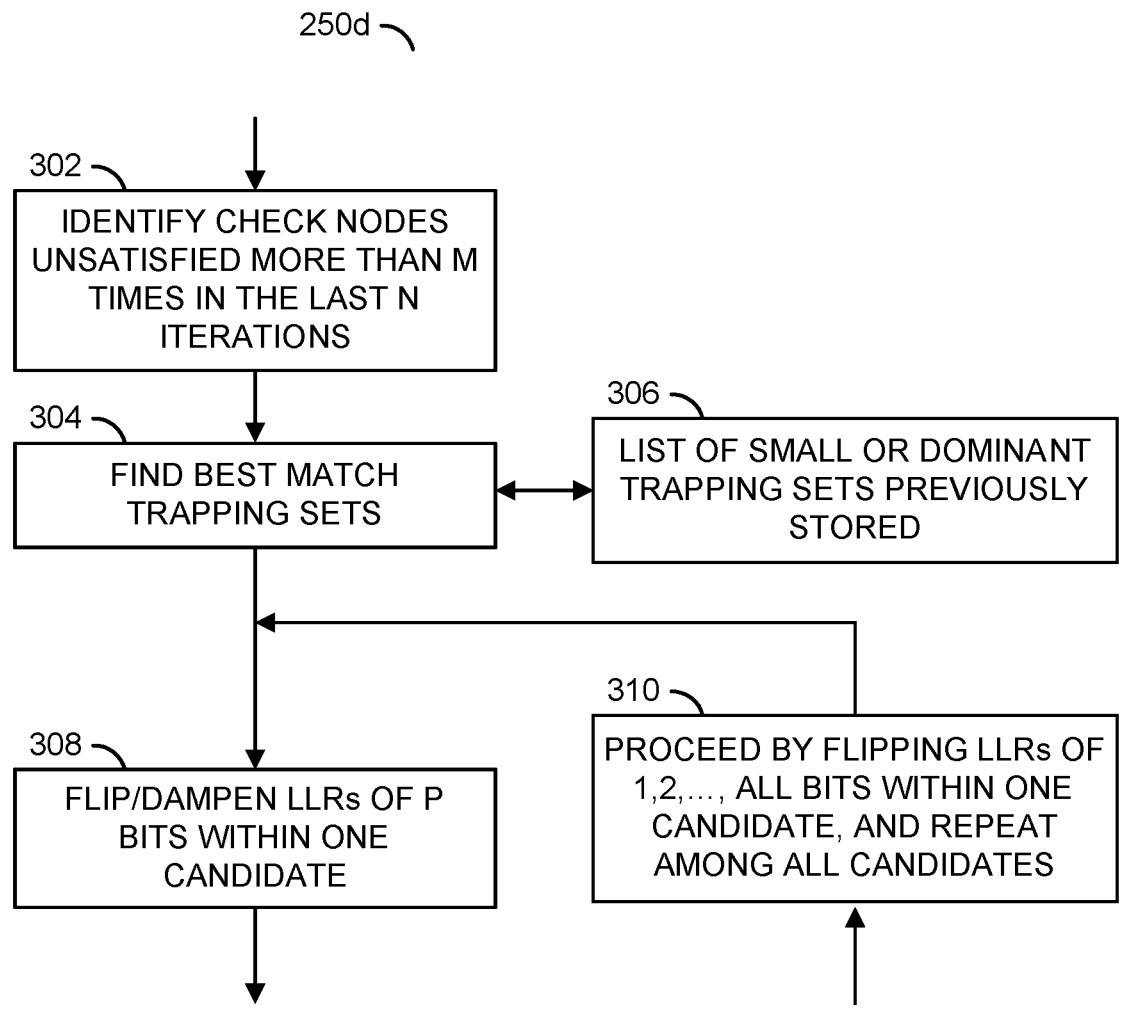
FIG. 12 is a flow diagram of a method for trapping set selection.

Referring to FIG. 12, a flow diagram of an example method 250d for trapping set selection is shown. The method 250d may be a variation of the step 250. The method (or process) 250d may be implemented in the circuit 100. The method 250d generally comprises a step (or state) 302, a step (or state) 304, a step (or state) 306, a step (or state) 308 and a step (or state) 310. The steps 302-310 may represent modules and/or blocks, embodiments of which include one or more of hardware circuitry, executable code (e.g., software, microcode, programming instructions, firmware, etc.) in a storage device used by the hardware circuitry and/or one or more electronic design tools.

After the initial decoding has failed and the counter value K is initialized in the steps 242-246 (FIG. 8), a candidate trapping set, or the bit locations to flip within the candidate trapping set, may be identified by the circuit 118. In the step 302, the circuit 118 may measure (or detect) a frequency of each check node that was unsatisfied for the last N iterations. Measuring over the last N iterations generally eliminates false alarms due to dynamics of the decoding process. A threshold may be used to determine if the check nodes being unsatisfied more than M times among the last N iterations should be considered for a search in the step 304. The search may seek a best matching trapping set candidate in the characterization list for small trapping sets previously stored in the step 306. In some embodiments, the value M may be less than a maximum number of iterations to account for a transient behavior of the circuit 118 at a beginning of the decoding. In various embodiments, the post-decoding techniques using the unsatisfied check nodes may use the dynamically found unsatisfied check nodes to compare with the characterization list.

In the step 308, the circuit 120 may flip and/or dampen the LLR values of the P bits of a single candidate. The decoding may be attempted again in the step 252 (FIG. 8) and the results evaluated in the decision step 254 (FIG. 8). If the decoding still fails, the step 310 may flip the LLR values of 1, 2, . . . all bits within a single candidate and repeat the flipping among all candidates. The completed step 310 may return to the step 308, attempt the decoding again in the step 252 (FIG. 8) and evaluate the results again in the decision step 254 (FIG. 8). The loop around the steps 250d, 252, 254 and 256 may continue until either the decoding passes or the counter value K reaches the maximum value K_MAX.

Targeted bit flipping and/or dampening may also be performed using the post-LDPC LLR values (or a posteriori decisions) rather than the channel LLR values generated by the circuit 94. In such cases, the unsatisfied check nodes returned by the circuit 118 may be used. The input LLR values entered into the circuit 118 may be reset to the post-LDPC LLR values with some targeted flipping/dampening. The decoding may then be re-run.

In some embodiments, the decoding may be re-run using the post-LDPC LLR values to reset all of the messages in the decoding. Such an approach may effectively dampen the LLR values with a dampening factor of unity or less. In other embodiments, the flipping and/or dampening in the steps 308 and 310 may also be based on the post-LLR values. In still other embodiments, each input LLR value may be reset to the maximum magnitudes with the sign extracted from the post-LDPC LLR values to ensure that the correct bits receive the highest reliability. Dampening and/or flipping may be limited to the chosen bits among the candidate trapping sets.

When the unsatisfied check node indices match exactly with the unsatisfied check nodes of a trapping set present in the characterization list, decoding is generally successful most of the time. By using bit-flipping on the channel LLR values based on the characterization list, one or more harmful small trapping sets in the characterization list may be broken. For trapping sets not in the characterization list, various methods may be employed to decide which LLR values to flip the sign or dampen the magnitude.

Figure 13:
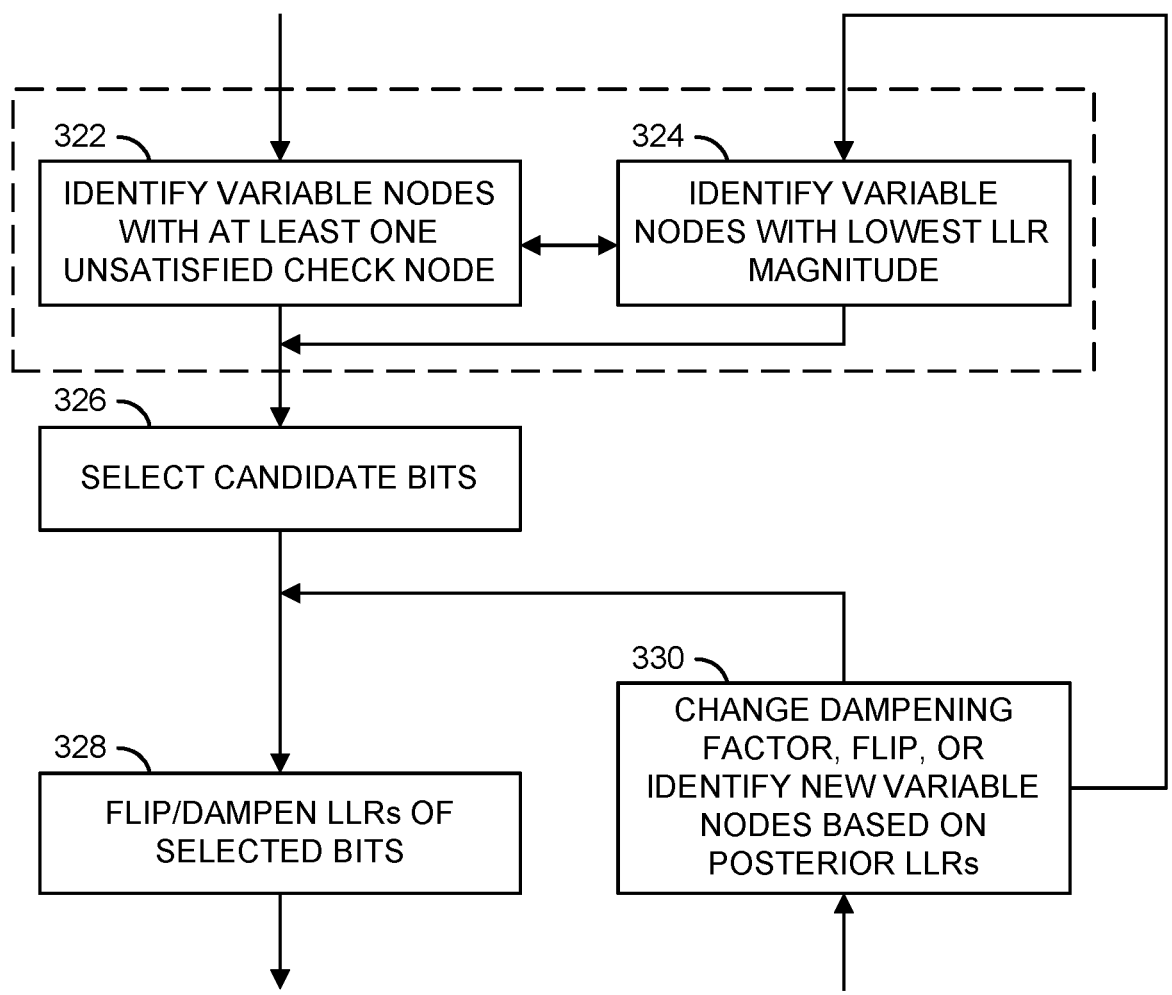
FIG. 13 is a flow diagram of a method of bit location selection.

Referring to FIG. 13, a flow diagram of an example method 250e for bit location selection is shown. The method 250e may be a variation of the step 250. The method (or process) 250e may be implemented in the circuit 100. The method 250e generally comprises a step (or state) 322, a step (or state) 324, a step (or state) 326, a step (or state) 328 and a step (or state) 330. The steps 322-330 may represent modules and/or blocks, embodiments of which include one or more of hardware circuitry, executable code (e.g., software, microcode, programming instructions, firmware, etc.) in a storage device used by the hardware circuitry and/or one or more electronic design tools.

The results generated by the circuit 118 after the initial failed decoding in the step 242 (FIG. 8) may help reduce the number of flips and/or dampening trials in terms of the number of dampening steps or the number of bits that are flip/dampened. In the step 322, the circuit 118 may provide a connection list of how many unsatisfied check nodes may be connected to each variable node. In the step 324, in parallel (or simultaneously) to the step 322, the circuit 118 may identify the variable nodes with the lowest posterior LLR magnitudes. For instance, bits connected to more than one unsatisfied check node and with a low posterior LLR magnitude may be candidates to flip the LLR values.

Combining the two pieces of information from the step 322 and the step 324, bits may be identified in the step 326 by the circuit 120 as candidates to have the respective LLR values flipped and/or dampened. In the step 328, the LLR values of the selected bits may be flipped and/or dampened. In various embodiments, the post-LDPC LLR values or the channel LLR values may be flipped and/or dampened.

In the step 252 (FIG. 8), the decoding may be run again with the flipped/dampened LLR values of the selected bits. If the decoding fails again, the dampening factor may be changed, the bits selected to be flipped may be changed and/or new variable nodes may be identified based on the posterior LLR values in the step 330. The completed step 330 may return to the step 328 for changes in the dampening factor and/or the flipping of the LLR values. The completed step 330 may return to the step 324 to select new bit locations based on the new posterior LLR values. The loop around the steps 250e, 252, 254 and 256 may continue until either the decoding passes or the counter value K reaches the maximum value K_MAX.

Figure 14:
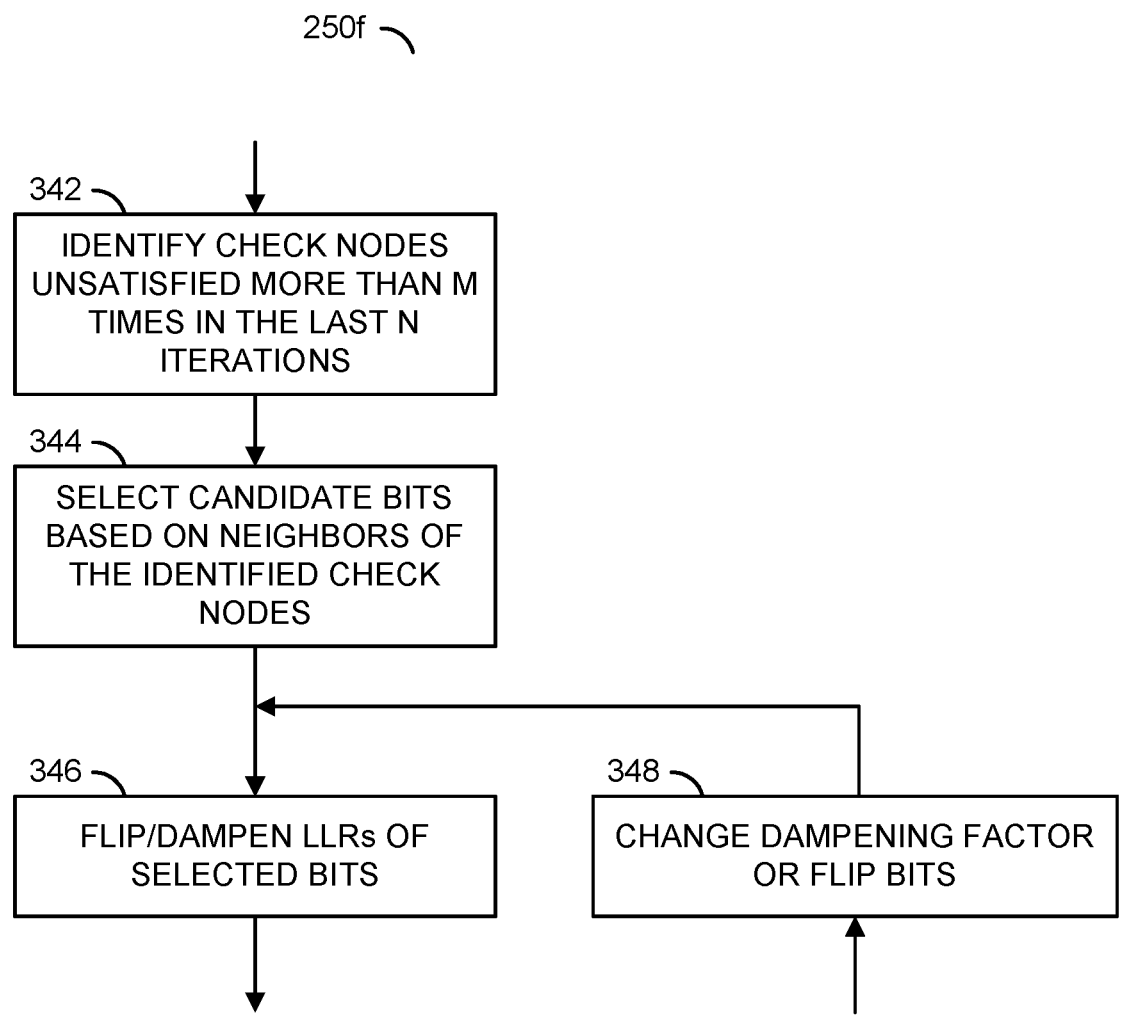
FIG. 14 is flow diagram of a method of bit selection.

Referring to FIG. 14, a flow diagram of an example method 250f for bit selection is shown. The method 250f may be a variation of the step 250. The method (or process) 250f may be implemented in the circuit 100. The method 250f generally comprises a step (or state) 342, a step (or state) 344, a step (or state) 346 and a step (or state) 348. The steps 342-348 may represent modules and/or blocks, embodiments of which include one or more of hardware circuitry, executable code (e.g., software, microcode, programming instructions, firmware, etc.) in a storage device used by the hardware circuitry and/or one or more electronic design tools.

Consider a situation where the unsatisfied check nodes do not provide a sufficiently good match with the characterization lists of the trapping sets. After the initial decoding has failed and the counter value K is initialized in the steps 242-246 (FIG. 8), the circuit 120 may identify check nodes that were unsatisfied more than M time in the last N iterations of the decoding in the step 342. The candidate bits for flipping/dampening may be selected in the step 344 by considering a neighborhood around the unsatisfied check nodes in the Tanner graph of the code. The neighboring variable (bit) nodes that are connected to (or intersect) the check nodes that were unsatisfied more than M time in the last N iterations generally form a set of selected bits to act upon. The bits in the set may be refined with the knowledge of the input/output LLRs, and/or the characterization list of the trapping sets. For example, one or more bits participating in a largest number of small trapping set may be identified to act upon with a higher priority.

In the step 346, the LLR values corresponding to the selected bits may be flipped and/or dampened. The decoding may be attempted again in the step 252 (FIG. 8). If the decoding fails according to the decision step 254 (FIG. 8), the dampening factor may be changed and/or the selection of the LLR values to flip may be changed in the step 348. The completed step 348 may return to the step 346 to flip and/or dampen the LLR values again. The loop around the steps 250f, 252, 254 and 256 may continue until either the decoding passes or the counter value K reaches the maximum value K_MAX.

In various embodiments, a minimum distance of the LDPC code may be used to select the candidate bits to flip and/or dampen. By definition, codewords may be described as trapping sets (d,0), where the variable d is greater than a minimum distance of the code (e.g., $d \geq d_{min}$). If the candidate bits to flip/dampen belong to a trapping set (a,b) included in a codeword (d,0), the dampening of the LLR values is generally better than flipping the LLR values. Dampening the LLR values generally targets a reduction of the mis-correction rate.

Embodiments of the present invention generally keep a characterization list containing information about small trapping sets, dominant large trapping sets, or both. When the decoding does not converge, indices of the unsatisfied check nodes may be checked. The indices may be used as an address to find a best match (or partial match) in the characterization list. The best match may indicate that the listed trapping set is a subset of a larger trapping set just found, or some overlap between the unsatisfied check nodes of the decoding and a listed trapping set.

The post-decoding techniques may choose one or several trapping sets to try based on the amount of match with the trapping set and a probability of occurrence of each trapping set, as decided by enumeration or simulation. Once candidate trapping sets are identified, several techniques may be available. For example, the channel LLR values of the bits may be dampened in a best effort to match a listed trapping set and re-run the decoding. The dampening may be a progressive dampening. The LLR values of the bits may be flipped in the best effort matching against the listed trapping set and then decoding may be re-run each time until a successful error correction is achieved.

In addition to mitigating error correction failures due to the trapping sets, various embodiments of the present invention may aid with other code topologies that have a finite number of variable nodes. For example, the mitigation techniques may be used to is situations involving absorbing sets, near-codewords, pseudo-codewords, and the like. An absorbing set may be a set of graphical substructures in the Tanner graph that cause various message-passing decoders to fail by converging to non-codeword states. A near-codeword may be a codeword that is relatively close to a correct codewords, differing in only a few positions. A pseudo-codeword of G is a vector obtained by reducing a codeword on a Tanner graph G', where G' represent a degree-L lift of G.

The functions and structures illustrated in the diagrams of FIGS. 1-14 may be designed, implemented, modeled, emulated and/or simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented by the preparation of ASICs (application specific integrated circuits), FPGAs (field programmable gate arrays), PLDs (programmable logic devices), CPLDs (complex programmable logic device), sea-of-gates, ASSPs (application specific standard products), one or more integrated circuits, circuitry based on hardware description languages, flash memory, nonvolatile memory, random access memory, read-only memory, magnetic disks, floppy disks, optical disks such as DVDs and DVD RAM, and magneto-optical disks, modifications of which will be readily apparent to those skilled in the art(s). As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. An apparatus comprising:
an interface configured to process a plurality of transfers to and from a medium; and
a control circuit configured to
generate a trapping set list of a plurality of trapping sets of a low-density parity check code,
classify a plurality of bit positions of the plurality of trapping sets as belonging to either a user bits field or a parity bits field of a codeword,
encode data using the low-density parity check code to generate the codeword, and present the codeword to the interface to transfer the codeword to the medium,
wherein
the generation of the codeword includes at least one of a shortening or a puncturing of a plurality of bit locations in the codeword in response to the classifying of the plurality of bit positions of the plurality of trapping sets, and
all of the data is held in the plurality of bit locations of the codeword other than the plurality of bit locations that are shortened or punctured.

2. The apparatus according to claim 1, wherein
the codeword is shortened by setting a subset less than all of the plurality of bit locations to a predetermined value, and
each of the plurality of bit locations set to the predetermined value is part of one or more of the plurality of trapping sets.

3. The apparatus according to claim 2, wherein the plurality of bit locations that are set to the predetermined value is limited to the user bits field.

4. The apparatus according to claim 2, wherein at least two of the plurality of bit locations that are set to the predetermined value are separated by one or more of the plurality of bit locations that hold the data.

5. The apparatus according to claim 1, wherein
the codeword is punctured by removing a subset less than all of the plurality of bit locations, and
one or more of the plurality of bit locations removed is not part of any of the plurality of trapping sets.

6. The apparatus according to claim 5, wherein the plurality of bit locations that are removed comprises at least one location in the user bits field and at least one location in the parity bits field.

7. The apparatus according to claim 5, wherein at least two of the plurality of bit locations that are removed are separated by one or more of the plurality of bit locations that hold the data.

8. The apparatus according to claim 1, wherein before the codeword is transferred to the interface the control circuit is further configured to remove the plurality of bit locations in the codeword that are shortened or punctured.

9. The apparatus according to claim 1, wherein the medium is a communication medium or a memory of a solid-state drive.

10. The apparatus according to claim 1, where the control circuit is further configured to
receive an additional codeword encoded with the low-density parity check code from the medium,
classify the plurality of bit positions of the plurality of trapping sets as belonging to either the user bits field or the parity bits field of the additional codeword,
lengthen the additional codeword to account for the plurality of bit locations that have been at least one of shortened or punctured in response to the classification of the plurality of bit positions of the plurality of trapping sets, attempt to decode the additional codeword to recover data, and
error correct the additional codeword over a plurality of cycles using information that characterizes a plurality of occurrence probabilities of the plurality of trapping sets in response to a failure to decode the additional codeword,
wherein
all of the data is held in the plurality of bit locations of the additional codeword other than the plurality of bit locations that were shortened or punctured, and
a plurality of log-likelihood ratio values used in the plurality of cycles are adjusted based on the information that characterizes the plurality of occurrence probabilities of the plurality of trapping sets.

11. An apparatus comprising:
a medium configured to transfer data; and
a controller configured to
generate a trapping set list of a plurality of trapping sets of a low-density parity check code,
classify a plurality of bit positions of the plurality of trapping sets as belonging to either a user bits field or a parity bits field of a codeword,
encode data using the low-density parity check code to generate the codeword, and transfer the codeword to the medium,
wherein
the generation of the codeword includes at least one of a shortening or a puncturing of a plurality of bit locations in the codeword in response to the classifying of the plurality of bit positions of the plurality of trapping sets, and all of the data is held in the plurality of bit locations of the codeword other than the plurality of bit locations that are shortened or punctured.

12. An apparatus comprising:
an interface configured to process a plurality of transfers to and from a medium; and
a control circuit configured to
generate a trapping set list of a plurality of trapping sets of a low-density parity check code,
receive a codeword encoded with the low-density parity check code from the medium,
classify a plurality of bit positions of the plurality of trapping sets as belonging to either a user bits field or a parity bits field of the codeword,
lengthen the codeword to account for a plurality of bit locations that have been at least one of shortened or punctured in response to the classifying of the plurality of bit positions of the plurality of trapping sets,
attempt to decode the codeword to recover data, and
error correct the codeword over a plurality of cycles using information that characterizes a plurality of occurrence probabilities of the plurality of trapping sets in response to a failure to decode the codeword, wherein
all of the data is held in the plurality of bit locations of the codeword other than
the plurality of bit locations that were shortened or punctured, and
a plurality of log-likelihood ratio values used in the plurality of cycles are adjusted based on the information that characterizes the plurality of occurrence probabilities of the plurality of trapping sets.

13. The apparatus according to claim 12, wherein
the adjustment of the plurality of log-likelihood ratio values dampens all of the plurality of log-likelihood ratio values after each of the plurality of cycles, and
an amount of dampening in each of the plurality of cycles is based on a number of the plurality of cycles that have previously failed to correct the codeword.

14. The apparatus according to claim 12, wherein the plurality of log-likelihood ratio values comprise a plurality of output log-likelihood ratio values generated during the attempt to decode the codeword.

15. The apparatus according to claim 12, wherein the plurality of log-likelihood ratio values comprise a plurality of posterior log-likelihood ratio values.

16. The apparatus according to claim 12, wherein
the information that characterizes the plurality of occurrence probabilities of the plurality of trapping sets comprises a characterization list that characterizes less than all of the plurality of trapping sets, and
the control circuit is further configured to determine a partial match between a plurality of unsatisfied check nodes and the characterization list to determine the plurality of log-likelihood ratio values to adjust.

17. The apparatus according to claim 12, wherein the information that characterizes the plurality of occurrence probabilities of the plurality of trapping sets comprises a characterization list that characterizes at least one of a plurality of non-dominant trapping sets or a plurality of dominant trapping sets.

18. The apparatus according to claim 12, wherein the control circuit is further configured to select among the plurality of log-likelihood ratio values to adjust based on a plurality of posterior log-likelihood ratio values associated with a plurality of variable nodes.

19. The apparatus according to claim 12, wherein the control circuit is further configured to select among the plurality of log-likelihood ratio values to adjust based on how many of a plurality of unsatisfied check nodes are connected to each of a plurality of variable nodes.

20. The apparatus according to claim 12, wherein the medium is a communication medium or a memory of a solid-state drive.

* * * * *